Jan. 26, 1971 P. FELOCK 3,559,002

SEMICONDUCTOR DEVICE WITH MULTIPLE SHOCK ABSORBING AND PASSIVATION LAYERS

Filed Dec. 9, 1968 2 Sheets-Sheet 1

INVENTOR:
PETER FELOCK

BY Carl O. Thomas

HIS ATTORNEY.

INVENTOR:
PETER FELOCK,
BY Carl O. Thomas
HIS ATTORNEY.

1

3,559,002

SEMICONDUCTOR DEVICE WITH MULTIPLE SHOCK ABSORBING AND PASSIVATION LAYERS

Peter Felock, Syracuse, N.Y., assignor to General Electric Company, a corporation of New York Filed Dec. 9, 1968, Ser. No. 782,083
Int. Cl. H01l *1/08, 1/10*
U.S. Cl. 317—234 10 Claims

ABSTRACT OF THE DISCLOSURE

In a rectifier a silicon crystal containing a junction is provided with a beveled periphery having a glass layer thereon which exhibits a thermal expansion differential with respect to the semiconductive crystal of less than $5\times10^{-4}$, a dielectric strength of at least 100 volts/mil, and an insulative resistance of at least $10^{10}$ ohm-cm. Silicone rubber overlies the glass layer acting as a shock protection shield and as a supplementary passivation layer. The silicone rubber exhibits a dielectric strength of at least 100 volts/mil and an insulation resistance of at least $10^{10}$ ohm-cm. Electrical contact to the silicon crystal is provided through a solder layer having a modulus of elasticity of less than $1.1\times10^{7}$.

This invention relates to improvements in junction semiconductor devices having a body of semiconductive material enclosed in a molded casement. The invention relates particularly to rugged, low cost transistors, thyristors, and rectifiers.

Semiconductor devices are known in which a pellet of semiconductive material is mounted on a metallic member which may serve as all or part of the electrical connector or external lead from one of the functionally significant regions of the transistor, such as the emitter or base or collector region. Other electrical connectors such as wires or other electrically conductive members are connected to the other functionally significant regions of the pellet, and may in turn be attached to, or may themselves constitute, additional external leads of the device. In such transistors the assemblage, including the pellet and at least a portion of the electrical connectors thereto, is encapsulated or potted in a suitable electrically insulative material such as an epoxy silicone, or phenolic resin from which the outer portions of the external leads extend. The external leads may additionally extend through a header of electrically insulative material such as a phenolic resin which serves to support, space, and orient the leads, and the encapsulating material desirably extends to and forms an encasement integrally joined to the header.

Semiconductor devices in which a rigid casement is molded directly to the semiconductive element, metallic support member, and leads have not offered the desired degree of protection to the semiconductive element from chemical contamination, thermal stress, and mechanical shock. A semiconductive element is typically formed of a thin, fragile wafer of a semiconductive material such as silicon, germanium, etc. A semiconductive element for a thyristor, for example, may exhibit a thickness of only about ⅕ the thickness of a dime. Mechanical shocks transmitted through the conductive metallic support member or through the rigid casement may fracture the semiconductive element. Where the semiconductive element is attached directly to the metallic support member thermally induced stress can fracture the pellet.

2

Semiconductive elements are particularly sensitive to chemical contaminants at the peripheral intersection of their junction regions. Molded casements have been found to lack sufficient fluid imperviousness to prevent peripheral junction contamination. Further, for many semiconductor devices high field intensities are developed in the junction regions that cannot be withstood by commonly employed molded casement materials. On occasion the thermal expansion mismatch between a metallic support member and a molded casement has caused a line of separation to develop at their intersection providing a direct fluid path to the semiconductive device. It has heretofore been proposed to utilize materials such as silicone rubber, the earth oxides, such as feldspar, bentonite, etc., as an intermediate layer between the semiconductive element and the casement, but no semiconductor device has been disclosed which protects against each of the hazards of thermal stress, mechanical shock, and chemical contamination encountered in the practical application of molded casement semiconductor devices to the degree desired.

It is an object of this invention to provide a molded casement semiconductor device exhibiting a superior level of protection to the semiconductive element from thermal stress, mechanical shock, and chemical contamination.

This and other objects of the invention are accomplished in one aspect by providing a semiconductor device comprised of semiconductive crystal means having first and second opposed major surfaces and having at least one junction therebetween. First and second contact means are associated with the first and second major surfaces. Means are provided for at least partially protecting the semiconductive crystal means from contamination comprising a glass passivation layer peripherally bonded to the semiconductive crystal means adjacent the junction and exhibiting a specific thermal expansion differential with respect to the semiconductive crystal means of less than $5\times10^{-4}$, a dielectric strength of at least 100 volts/mil, and an insulative resistance of at least $10^{10}$ ohm-cm. A pliant, relatively fluid impervious means sealingly surrounds the protecting means to supplement the protection to fluid contamination of the semiconductive crystal means provided by the protecting means and to create a shock absorbing envelope around the semiconductive crystal means and the glass layer. The fluid impervious means exhibits a dielectric strength of at least 500 volts/mil and an insulative resistance of at least $10^{10}$ ohm-cm. A molded casement envelops the pliant means.

The invention may be better understood by reference to the following detailed description considered in conjunction with the drawings, in which FIG. 1 is a vertical section of a semiconductor device according to the invention;

Figure 1:
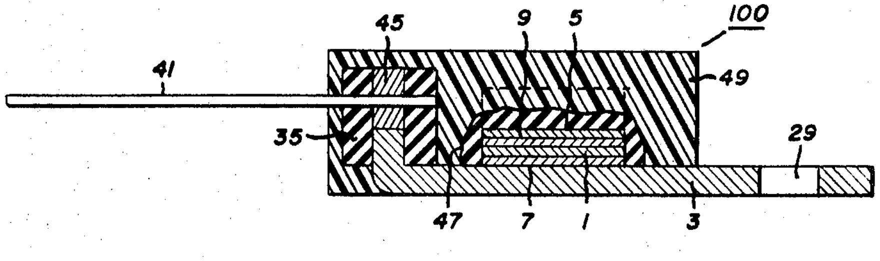
Figure 2:
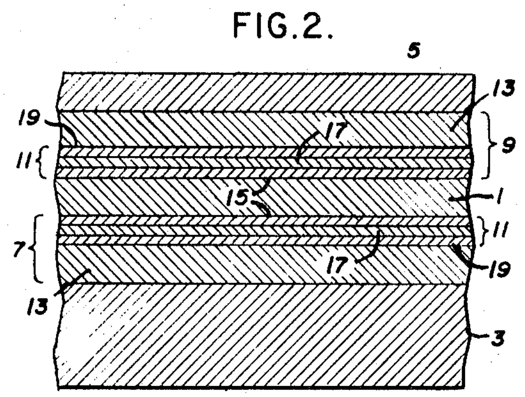
FIG. 2 is a sectional detail of a semiconductive element mounted between electrical connectors with a contact system and stress absorbing members adjacent opposite faces.

A semiconductor device 100 is disclosed in FIG. 1 having a junction containing monocrystalline semiconductive element 1 bonded to a heat sink 3 and an electrical connector 5 through bonding assemblies 7 and 9, respectively. As shown in FIG. 2 the bonding assemblies are each comprised of a contact system 11 and a stress absorbing layer 13. In a preferred form of the invention each contact system is comprised of a layer 15 of chromium bonded directly to the surface of the semiconductive element having a layer 17 of nickel bonded directly thereto. The nickel layer is maintained free of an oxide coating by a sliver layer 19 bonded thereto. In a preferred form the shock absorbing layers are formed of a soft solder capable of alloying silver. For purposes of description the term "soft solder" is used to define solders having a modulus of elasticity under ambient conditions of less than $1.1\times10^7$ lbs./in.$^2$. Such solders are sufficiently pliant to accommodate without fracturing shocks in handling and differentials in thermal expansion rates of adhered surfaces. It is preferred to utilize those soft solders capable of alloying in the molten state with silver, such as lead-tin, lead-tin-indium, lead-tin-silver, lead-antimony, etc. Widely used and preferred soft solders are comprised of a major proportion of lead and/or tin and a minor proportion of silver. A specific preferred soft solder consists essentially of, on a weight basis, 90% lead, 5% indium, and the balance silver. Some or all of the silver content of the solder may be derived from the silver layer of the contact system. It is anticipated that the silver layer of the contact system may be completely alloyed with the solder in assembly so that no separate silver layer remains, although a somewhat better bond is obtained with a separate silver layer. The preferred forms of the bonding assemblies are more fully discussed in Frank et al. copending patent application Ser. No. 782,084, filed concurrently herewith, titled Novel Contact System for High Current Semiconductor Devices, the disclosure of which is here incorporated by reference. Instead of using a soft solder layer as a shock absorbing layer, the semiconductive element may be hard soldered or otherwise attached directly to the heat sink where limited thermal cycling is anticipated. Also, the semiconductive element may be hard soldered to a back up plate, which acts as a shock absorbing layer.

Figure 3:
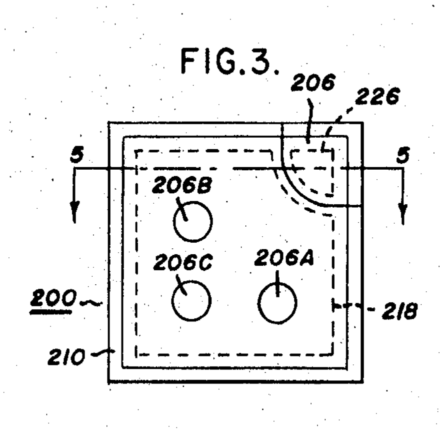
FIGS. 3 and 4 are plan and bottom views, respectively, of a semiconductive element for a controlled rectifier, with contact areas being shown in dashed lines.
Figure 4:
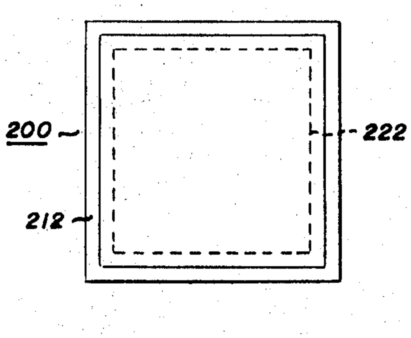
Figure 5:
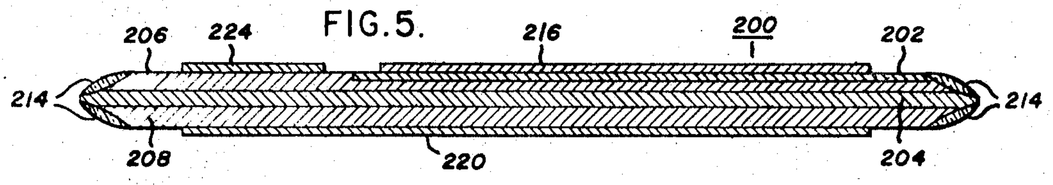
FIG. 5 is a section along line 5—5 in FIG. 3, with the contact system being schematically shown attached to the semiconductive element.

The semiconductive element 1 may take the form of a thyristor semiconductive element 200 as illustrated in FIGS. 3, 4, and 5. The element 200 is comprised of first and third layers 202 and 204, respectively, of a first conductivity type and second and fourth layers 206 and 208, respectively, of an opposite conductivity type. The upper and lower edges of the element are beveled at 210 and 212, respectively. A dielectric passivation layer 214, such as glass, is adhered to the beveled edges. A first contact system 216, schematically illustrated in FIG. 5, overlies the area 218 indicated by dashed lines in FIG. 3. It is noted that the second layer extends through the first layer 202 in three circular areas 206A, 206B, and 206C to electrically connect the second layer to the first contact system. A second contact system 220 is adhered to the opposite face of the semiconductive element and occupies the area indicated by dashed line 222 in FIG. 4.

A gate contact system 224 is adhered to the second layer over the area 226 designated by dashed line in FIG. 3.

Figure 6:
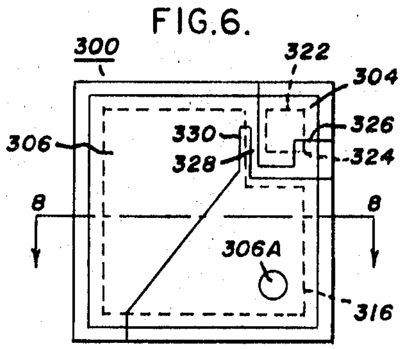
FIGS. 6 and 7 are plan and bottom views, respectively, of a semiconductive element for a triac, with contact areas being shown by dashed lines.
Figure 7:
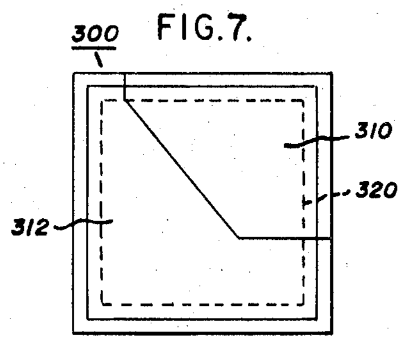
Figure 8:
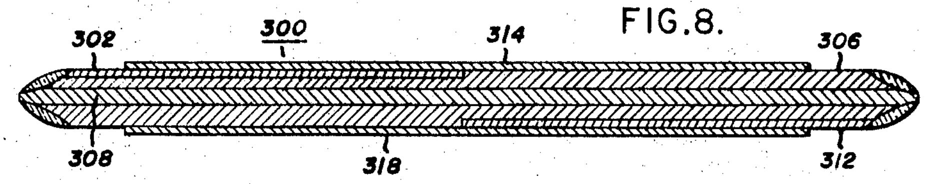
FIG. 8 is a section along line 8—8 in FIG. 6, with the contact system being schematically shown attached to the semiconductive element.

Alternately, the semiconductive element 1 may take the form of a triac semiconductive element 300 as illustrated in FIGS. 6, 7, and 8. The semiconductive element 300 is provided with a first layer 302 and a gate layer 304 which are laterally spaced and of like conductivity type. Both the first and gate layers form junctions with a second layer 306 of opposite conductivity type. Layers 308 and 312 are of like conductivity type as layers 302 and 304, while fourth layer 310 is of like conductivity type as layer 306. It can thus be seen that in a section through the first layer area the semiconductive element may include a P-N-P-N of N-P-N-P sequence of layers, except for a small area 306A where the central layer 306 extends upwardly through the first layer 302 and only a three layer sequence is present. It can also be seen that a section through the gate layer 304 would include a P-N-P-N-P or N-P-N-P-N sequence of layers. A first contact system 314 overlies the area defined by dashed lines 316 while a second contact system 318 overlies the area defined by dashed lines 320. It is to be noted that both the first and second contact system overlie both P and NN conductivity type regions. A gate contact system, not shown, overlies the area 322 primarily overlying a portion of the gate layer 304. A small areal portion of the gate contact system overlies an area 324, which is part of a somewhat larger area 326 of the layer 306. The surface interconnection of the area 326 to the main surface portion of the layer is through a thin and indirect connecting portion 328. It can be seen that the connecting portion 328 is thin because of the close spacing of the first and gate layers and because of a projecting finger portion 330 associated with the first layer. Since the layer 306 underlies both the first and gate layers the portion 326 is not dependent on the connecting portion 328 for electrical interconnection with the major portion of the layer 306, but rather this connecting portion serves primarily merely to electrically separate the gate and first layers.

The basic characteristics of thyristor and triac semiconductive elements has been widely discussed in numerous patents and publications including the SCR Manual, 4th ed., published 1967 my the General Electric Company. Accordingly, it is considered unnecessary to describe in detail the operative characteristics of the semiconductive elements 200 and 300 beyond noting the contribution of certain salient features. The beveled edges of the semiconductive elements may serve to increase the potential level of reverse biasing that can be withstood by the devices without breakdown when the angle of beveling is properly chosen. More importantly, beveling offers the advantage of allowing non-destructive bulk breakdown to occur in preference to destructive surface breakdown. The glass edge passivation layer coacting with the beveled edge of the semiconductive elements adjacent the junctions serves to further enhance the reverse breakdown characteristics, as is more fully discussed by Davies et al. in copending patent application Ser. No. 255,037, filed Jan. 30, 1963, now U.S. Pat. No. 3,491,272, titled Semiconductive Devices With Increased Voltage Breakdown Characteristics, the disclosure of which is here incorporated by reference. Since many of the contacts overlie both P and N type regions, the preferred contact system 11 described above is particularly advantageous, since this contact system adheres well to both P and N type conductivity regions. The areas 206A, 206B, and 206C in which the layer 206 is associated with the contact system 216 directly provide a current flow path through the semiconductive element parallel to the gate and reduce the sensitivity of the semiconductive element to switching to the high conductivity mode in response to transient or cyclic current or voltage pulses or in response to high current densities caused by increased junction temperature, rapid rise of applied voltage, etc. The area 306A associated with the semiconductive element 300 performs a similar function. The contact area 324 between the gate contact system and the second layer 306 allows a lower gate signal to switch the semiconductive element 300 to its high conductivity mode when the junction between the gate layer 304 and layer 306 is reverse biased. The area 324 is positioned at a somewhat remote location from the main portion of the layer 306 to avoid bringing the entire layer 306 to the potential of the gate. The areas 206A, 206B, 206C, 306A, and 324 may be provided in any desired configuration or number. These areas, together with their functions, may be individually or collectively omitted.

Figures 9, 10:
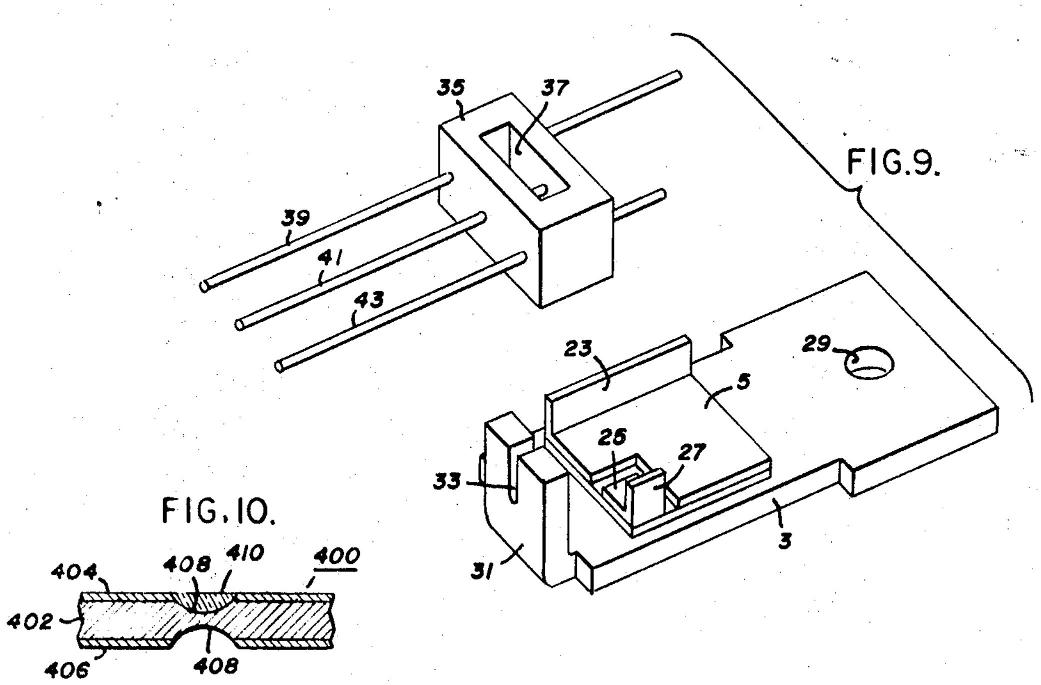
FIG. 9 is an isometric view of a portion of the semiconductor device prior to complete assembly.
FIGS. 10 and 11 are sectional details of semiconductive elements prior to pelletizing, prior to and subsequent to firing the glass passivation layers, respectively.

In FIG. 9 the semiconductive element, contact systems, and shock absorbing layers are shown schematically as a semiconductive assembly 21 bonded between the heat sink 3 and the electrical connector 5. The electrical connector is provided with an upstanding flange portion 23 extending along one edge of the semiconductive assembly. A gate connector 25 is laterally spaced from the electrical connector 5 and is also bonded to the upper surface of the semiconductive assembly. The gate connector is provided with an upstanding flange portion 27.

The heat sink is provided with an aperture 29 laterally spaced from the semiconductive assembly which may be used to mount the heat sink in thermally conductive relation with a chassis or cooling fin array. Along one edge of the heat sink an integrally joined foot portion 31 is provided. As shown, the foot portion is formed integrally with the heat sink and bent upwardly in perpendicular relation thereto. The foot portion is provided with a groove 33.

A rigid header 35 formed of an electrically insulative material, such as an epoxy, silicone, or phenolic resin, is provided with a central window 37 sized to slidably fit over the upstanding foot portion of the heat sink. The header carries three parallel electrical leads 39, 41, and 43. The leads 39 and 43 are mounted by the header to avoid intersection with the windows, but to tangentially mate with the upstanding flange portions 23 and 27 of the electrical connector 5 and gate connector 25, respectively. The electrical leads are soldered or otherwise suitably electrically interconnected with the flange portions. The electrical lead 41 extends into the window of the header so that as the header is slidably fitted onto the foot portion this lead mates with the groove in the foot portion. The window and groove may then be filled with solder to interconnect the lead 41 to the heat sink.

When the header is in position with the electrical leads attached to the heat sink and the electrical connectors, a pliant, substantially fluid impervious material 47 is positioned to encapsulate the semiconductive assembly and at least a portion of the electrical connectors. A casement 49 is then molded around the pliant material, electrical leads, header, and heat sink to form the completed semiconductor device.

The passivation layers associated with the edges of the semiconductive elements are formed of a glass exhibiting a thermal expansion differential with respect to the semiconductive crystal of less than $5\times10^{-4}$. That is, if a unit length is measured along the surface of a semiconductive element with a layer of glass attached at or near the setting temperature of the glass and the semiconductive element and glass are thereafter reduced in temperature to the minimum ambient temperature to be encountered in use by a semiconductor device in which the semiconductive element is to be incorporated, the observed difference in the length of the glass layer as compared to the semiconductive element over the unit length originally measured at any temperature between and including the two extremes should be no more than $5\times10^{-4}$. It is appreciated that the thermal expansion differential so expressed is a dimensionless ratio of difference in length per unit length. By maintaining the thermal expansion differential below $5\times10^{-4}$ (preferably below $1\times10^{-4}$), the thermal stresses transmitted to the glass by the semiconductive element are held to a minimum, thereby reducing the possibilty of cleavage, fracture, or spawling of the glass due to immediately induced stresses or due to fatigue produced by thermal cycling.

Since the glass layer bridges at least one junction of the semiconductive element, it is important that the glass exhibit an insulative resistance of at least $10^{10}$ ohm-cm., so as to avoid shunting any significant leakage current around the junction to be passivated. To withstand the high field strength likely to be developed across the junction during reverse bias, as is particularly characteristic of rectifiers, the glass layer is chosen to exhibit a dielectric strength of at least 100 volts/mil and preferably at least 500 volts/mil for high voltage rectifier uses. When the semiconductive element is properly peripherally beveled and provided with a glass passivation layer the semiconductive element is capable of withstanding reverse biasing at exceptionally high potential levels without being destroyed.

Two exemplary glasses that meet the preferred thermal expansion differential, dielectric strength, and insulative resistance characteristics discussed above and which are considered particularly suitable for use with silicon semiconductive elements are set out in Table I, percentages being indicated on a weight basis.

TABLE I

| Glass Number | 45 | 351 |
|---|---|---|
| Composition, percent: | | |
| $SiO_2$ | 12.35 | 9.4 |
| ZnO | 65.03 | 60.0 |
| $Al_2O_3$ | 0.06 | ------- |
| $B_2O_3$ | 22.72 | 25.0 |
| $CeO_2$ | | 3.0 |
| $Bi_2O_3$ | | 0.1 |
| PbO | | 2.0 |
| $Sb_2O_3$ | | 0.5 |

Glass is commercially available under the trade name "GE Glass 351" and Glass 45 is available under the trade name "Pyroceram 45." Other zinc-silico-borate glasses are available that meet the required physical characteristics. For example, the zinc-silico-borate glasses disclosed by Martin in U.S. Pat. No. 3,113,878, may be employed.

Figure 11:
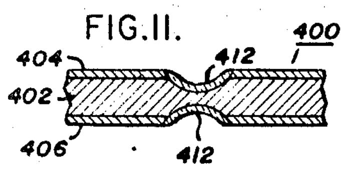

While a glass passivation layer applied to the junction of a semiconductive element offers a substantial degree of protection to chemical contamination of the junction tending to alter its electrical properties, it has been observed that it is frequently difficult to achieve the desired degree of passivation using a single glass layer. This may be better understood by reference to FIGS. 10 and 11, in which a semiconductive wafer 400 is shown intended to be subdivided into a plurality of semiconductive elements. The wafer is typically formed of a central region 402 of a first conductivity type having planar diffused surface regions 404 and 406 of opposite conductivity type. The demarcation of separate semiconductive elements to be formed from the wafer is achieved by etching aligned grooves 408 on opposite faces of the wafer. The etched grooves also provide the edge beveled desired in the junction regions. The glass passivation layers are applied to opposite sides of the wafer sequentially. The grooves in the upper face of the wafer are loaded with a finely divided glass frit, and the wafer is fired to the fusion temperature of the frit. When the frit melts the glass forms a dense, substantially void-free layer 412. Since the voids are removed, the glass layer forms only a thin coating on the semiconductive element and does not occupy more than a minor portion of the groove, even though the groove was initially filled with frit. To form glass layers on the opposite side of the wafer, it is necessary to invert the wafer and repeat the process. If it is desired to thicken the glass layer it is necessary to repeatedly fill the grooves with glass frit and fire, but because of the large volume loss in firing it is not practical in most instances to completely fill the grooves with a dense glass layer. To divide the wafer into discrete pellets the wafer is broken apart along the grooves. This, of course, offers the risk of mechanically damaging the glass. While the process is set out for a three layer, two junction semiconductive element, it is appreciated that the same process is also widely used in the manufacture of two layer, single junction semiconductive elements, as well as four layer, three junction semiconductive elements.

To supplement the glass layers in protecting the semiconductive element from chemical contamination as well as to protect the glass layer and semiconductive element from stress and mechanical shock, it is a feature of this invention that a pliant, substantially fluid impervious material is interposed between the glass layer lying at the junction region of the semiconductive element and the molded casement that forms a housing for the device. While the pliant material is displaced by the glass layer from the highest field gradients, which occur at the peripheral junction regions, the pliant material is nevertheless subjected to substantial potential gradients and accordingly should exhibit a dielectric strength of 100 volts/mil and an insulation resistance of at least $10^{10}$ ohm-cm. Where the semiconductor device is to be used as a high voltage rectifier, it is preferred that the dielectric strength of the pliant material be at least 200 volts/mil. Pliant materials meeting these electrical characteristics, exhibiting a high degree of fluid impermeability, and exhibiting a high degree of thermal stability are organopolysiloxane resins. These resins are preferably employed in their cured elastomeric form, typically designated as silicone rubber. Exemplary preferred elastomeirc organopolysiloxane resins are disclosed by Berridge in U.S. Pat. No. 2,843,555 and by Modic in copending patent application Ser. No. 514,-650, filed Dec. 17, 1965, the disclosure of which patent application is here incorporated by reference. As is well recognized the resins may be blended with inorganic dielectric fillers so long as the desired electrical properties are retained. It is, however, preferred in order to retain a maximum degree of fluid imperviousness that no such fillers be employed. It is preferred to employ a resilient elastomer instead of earth oxides, as has heretofore been suggested in the art, since the resilient elastomers possess a higher imperviousness to fluids, being unitary in character rather than particulate like earth oxides. Further, resilient elastomers are better able to absorb mechanical shocks and minimize the amount of shock transmitted to the semiconductive element and its glass passivation layer.

Considering the semiconductor device 100, it can be seen that the device is provided with a high degree of protection from chemical contamination of the semiconductive element, thermally induced stresses, and mechanical shocks. The bonds assemblies 7 and 9 provide a tenacious, low resistance bond between the heat sink 3 and electrical connector 5 and the semiconductive element 1. The soft solder shock absorbing layers 13 at the same time protect the semiconductive element against thermally induced stresses attributable to the divergent thermal expansion characteristics of the heat sink and electrical connector as compared to the semiconductive material. Fluid that would tend to contaminate the junction region of the semiconductive element 1 must penetrate not only the casement 49 (which may break loose from the heat sink on thermal cycling or itself give off contaminating fluids on heating) and the glass passivating layers (which may be fractured in pelletizing or be too thin to provide full passivation), but also the encapsulating pliant, substantially fluid impervious layer 47. This layer also functions to prevent mechanical shocks applied to the casement from being transmitted directly to the glass layers, thereby risking their fracture. The semiconductor device is further protected in that the electrical leads are mounted in the desired relation by the header and need not be stamped from a connecting strip external of the device after assembly of the semiconductor device is complete. Such stamping procedure offers the opportunity of transmitting mechanical shocks through the leads to the semiconductive element.

While the invention has been described with reference to certain preferred embodiments, it is appreciated that other applications will readily occur to those skilled in the art. For example, while the invention has been described with reference to three lead semiconductor devices, such as triacs and thyristors, the invention may be applied to any semiconductor device having at least one junction. For example, in applying the invention to a simple rectifier having two leads, the header would be modified to accommodate two leads rather than three. Variations in header structure are disclosed in copending patent application Ser. No. 782,183 filed on even date with this application, and titled Protected Semiconductor Devices and Processes for Their Fabrication. It is, of course, not necessary that the semiconductive element be electrically associated with the heat sink as in the preferred forms. An electrically insulative, thermally conductive layer may be interposed between the semiconductive element and heat sink, as is well appreciated in the art. The employment for a heat sink as a separate structural element is not essential where moderate current levels are to be observed. It is considered that the invention is generally applicable to molded casement semiconductor devices. It is accordingly intended that the scope of the invention be determined with reference to the following claims.

What I claim as new and desire to secure by Letters Patent of the United States is:

1. A semiconductor device comprising
- semiconductive crystal means provided with first and second opposed major surfaces and having at least one junction therebetween,
- first and second contact means associated with said first and second major surfaces,
- means for at least partially protecting said semiconductive crystal means from contamination comprising a glass passivation layer peripherally bonded to said semiconductive crystal means adjacent said junction and exhibiting a specific thermal expansion differential with respect to said semiconductive crystal means of less than $5\times10^{-4}$, a dielectric strength of at least 100 volts/mil, and an insulative resistance of at least $10^{10}$ ohm-cm.
- pliant, relatively fluid impervious means sealingly surrounding said protecting means to supplement the protection to fluid contamination of said semiconductive crystal means provided by said protecting means and to create a shock absorbing envelope around said semiconductive crystal means and said glass layer and exhibiting a dielectric strength of at least 100 volts/mil and an insulative resistance of at least $10^{10}$ ohm-cm., and
- a molded casement enveloping said pliant means.

2. A semiconductor device according to claim 1 in which said semiconductive crystal means is peripherally beveled at least adjacent said one junction.

3. A semiconductor device according to claim 1 in which said glass passivation layer exhibits a specific thermal expansion differential with respect to said semiconductive crystal means of less than $1\times10^{-4}$.

4. A semiconductor device according to claim 1 in which said glass passivation layer exhibits a dielectric strength of at least 500 volts/mil.

5. A semiconductor device according to claim 1 in which at least one of said contact means include a shock absorbing means electrically interconnecting said semiconductive crystal means with means providing a terminal for said semiconductor device.

6. A semiconductor device according to claim 5 in which said shock absorbing means includes a solder layer having a modulus of elasticity of less than $1.1\times10^{7}$ lbs./in.$^2$.

7. A semiconductor device according to claim 1 in which said first contact means includes an electrically conductive heat sink and said pliant means is sealingly associated with said heat sink.

8. A semiconductor device according to claim 1 in which said pliant, relatively fluid impervious means is comprised of an organopolysiloxane resin.

9. A semiconductor device according to claim 1 in which said pliant relatively fluid impervious means is comprised of a resilient elastomer.

10. A semiconductor device according to claim 1 in which said pliant, relatively fluid impervious means exhibits a dielectric strength of at least 200 volts/mil.

References Cited

UNITED STATES PATENTS

| | | | |
|---|---|---|---|
| 3,237,272 | 3/1966 | Kallander | 317—234X |
| 3,328,650 | 6/1967 | Boyer | 317—234 |
| 3,441,422 | 4/1969 | Graff | 106—53 |

JOHN W. HUCKERT, Primary Examiner

R. F. POLISSACK, Assistant Examiner

U.S. Cl. X.R.

317—235